United States Patent [19]

Mager

[11] 3,725,789

[45] Apr. 3, 1973

[54] TEMPERATURE CONTROLLED CLOCKING OF LOGIC CIRCUITS

[75] Inventor: Donald V. Mager, Minneapolis, Minn.

[73] Assignee: Sperry Rand Corporation, New York, N.Y.

[22] Filed: Dec. 21, 1970

[21] Appl. No.: 99,879

[52] U.S. Cl. ........................328/3, 307/310, 328/92, 235/152

[51] Int. Cl. ..............................................H03k 7/00

[58] Field of Search ...................331/66, 70; 307/310

[56] References Cited

UNITED STATES PATENTS

| | | | |
|---|---|---|---|
| 3,449,629 | 6/1969 | Wigert et al. | 315/194 X |
| 3,523,182 | 8/1970 | Phillips et al. | 331/66 X |
| 3,488,529 | 1/1970 | Howe | 307/310 |

*Primary Examiner*—Herman Karl Saalbach
*Assistant Examiner*—B. P. Davis
*Attorney*—T. J. Nikolai, Kenneth T. Grace and D. W. Phillion

[57] ABSTRACT

A variable frequency pulse generator whose pulse repetition rate is controlled as a function of temperature is used as a source of gating signals for a logic array so that the propagation delay of data signals through the logic array is optimized.

4 Claims, 2 Drawing Figures

INVENTOR
DONALD V. MAGER
BY Thomas J. Nikolai
ATTORNEY

TEMPERATURE CONTROLLED CLOCKING OF LOGIC CIRCUITS

BACKGROUND OF THE INVENTION

The propagation delay of digital data signals through a semiconductor logic array is temperature dependent. Specifically, at normal room temperatures (25° C) the propagation delay of data signals through the array is a minimum. However, at either temperature extreme (e.g., −54° C and +70° C) the propagation delay is significantly higher than the minimum value. In fact this variation may be as high as 25 percent. It has accordingly been the practice in the past to operate these semiconductor logic arrays at speeds that are slow enough to accommodate the worst case propagation delays existing at the temperature extremes with the result that the overall performance of the logic network is degraded.

SUMMARY OF THE INVENTION

In accordance with the teachings of the present invention there is provided a clock pulse generator along with a temperature sensitive control means which is adapted to control the pulse repetition rate of the clock pulse generator. The output signals from the clock pulse generator are applied to the semiconductor logic array in a conventional manner and are used to gate digital data signals through the array. The characteristics of the temperature sensitive control means are such that at normal room temperatures, the temperature at which the propagation delay of the array is a minimum, the repetition rate of the clock pulse generator is substantially higher than when the temperature of the array is at either of its extremes. Thus, the digital data signals are allowed to propagate through the array at a higher rate at normal operating temperatures but at a slower rate at higher than normal or lower than normal temperatures so as to optimize the normal delay characteristics of semiconductor logic circuit arrays.

It is accordingly an object of the present invention to provide a novel arrangement and method of varying the pulse repetition rate of the source of clocking signals for a semiconductor logic circuit array as a function of array temperature.

Another object of the invention is to provide a means of adjusting the pulse repetition rate of the clocking or gating signals applied to a semiconductor logic circuit array as a function of temperature such that the propagation rate of signals through the array can be optimized.

These and other objects and features of the invention, and the advantages thereof will become more apparent by reference to the following description taken in conjunction with the accompanying drawings wherein:

DESCRIPTION OF THE PREFERRED EMBODIMENT

Figure 1:
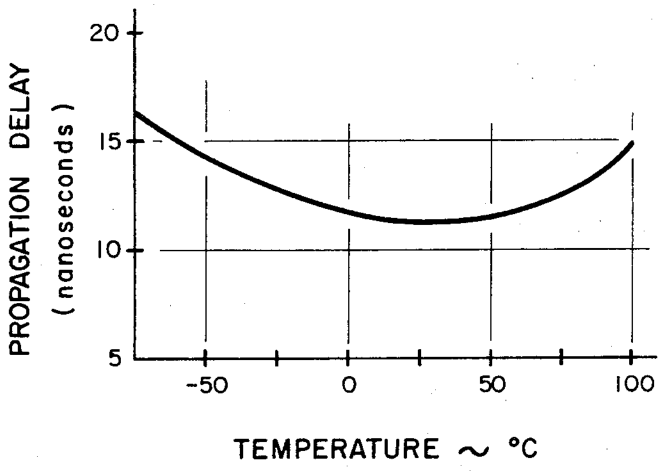
FIG. 1 illustrates by means of a graph the manner in which the propagation delay time of a semiconductor logic circuit varies as a function of temperature.

Referring now to FIG. 1, there is shown a characteristic curve for a typical logical switching circuit employing a semiconductor as the active element therein. The plot illustrates the manner in which the propagation delay time varies with the temperature. The propagation delay of a semiconductor gate is defined as the time required for a signal to propagate through the gate. A more precise definition in terms of input and output pulse switching levels is set forth at page 62 of a book entitled "Microelectronics Circuits and Applications" by John M. Carroll, published by McGraw-Hill Book Company, Copyright 1965. As is illustrated by the curve of FIG. 1, the propagation delay of a semiconductor logic stage is a minimum at normal room temperature (25° C) and then increases by as much as 25 percent as the temperature approaches a low extreme (−50° C) or a high temperature (100° C).

In many digital systems, such as computers and the like, a number of logic circuits are connected in tandum and accurately timed clock signals are employed to step the data signals through the array of interconnected logic circuits. When designing logic circuit arrays, it has been the practice in the past to operate the clock at a pulse repetition rate which will accommodate the worst case situation observed at the lower and upper temperature extremes. This is to ensure that the logic network will operate properly over the full range of temperatures to which it might be exposed. In other words, the clock must be operated at a substantially lower pulse repetition rate to accommodate the propagation delay observed at the temperature extremes than would be permissable if the circuitry were operating at normal room temperature. Because it is the clock frequency that determines the rate at which data can be processed through a logic array, it is apparent that the amount of data that can be processed in a given period of time will be substantially less in the prior art design because of the allowance for the propagation delay at temperature extremes.

Figure 2:
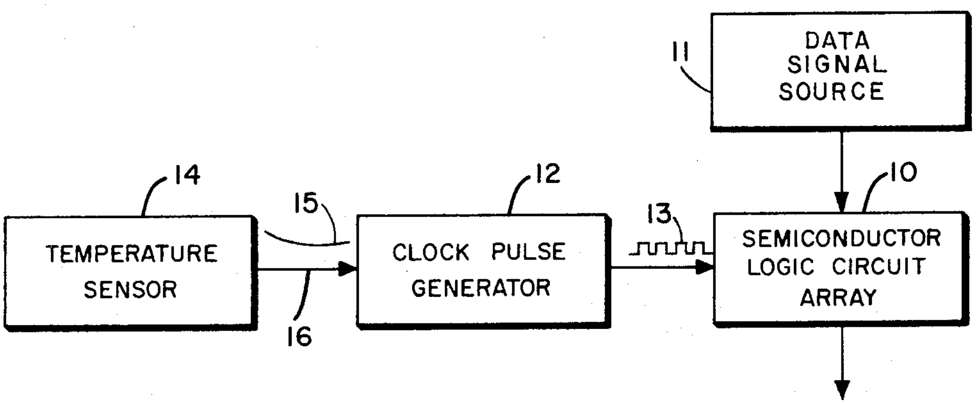
FIG. 2 illustrates by means of a block diagram one embodiment of the invention.

Referring now to FIG. 2, there is shown a block diagram of the preferred embodiment of the present invention. As is illustrated, a semiconductor logic circuit array 10 is connected to a generator 12 of clock pulse signals 13. While FIG. 2 illustrates the logic circuit array 10 in block form, it is to be understood that the array may be quite simple, involving only a few logic levels or may be quite complex, involving an entire digital data processor. The clock pulse generator 12 may take the form of a variable frequency oscillator and pulse shaper, many forms of which are well known to those skilled in the art. The clock pulse generator 12 supplies the requisite clock signals 13 to the logic array 10 to permit the data signals (not shown) from data signal source 11 to be advanced through the network or array.

Operatively connected to the clock pulse generator 12 is a temperature sensor 14 which functions to monitor the ambient temperature of the semiconductor logic circuit array 10 and produce an electrical signal 15 on the output line 16 which signal 15 is proportional to the varying temperature of the array 10. The analog signal 15 on line 16 is coupled to the clock pulse generator 12 and serves to vary the frequency of oscillation (the pulse repetition rate) of the generator.

In one arrangement, the clock pulse generator 12 may include a voltage controlled oscillator (VCO) which operates to produce a variable frequency output signal depending upon an analog voltage applied to it. The temperature sensor 14 may then comprise a thermistor serially connected with a direct current voltage source such that when the temperature of the thermistor varies, the voltage obtained at the thermistor terminal will also vary in a predetermined manner. This voltage, when applied to the input of the voltage controlled oscillator, will cause the frequency of the signal generated by the oscillator to also vary. By properly selecting component values, the clock pulse generator 12 may be caused to produce clock pulses 13 at a relatively high repetition rate when the temperature of the semiconductor logic circuit array 10 is near normal room temperature such that the propagation delay through the array is a minimum. However, when the temperature of the array moves towards either of the two temperature extremes, the temperature sensor 14 will apply a differing voltage to the input of the clock pulse generator 12 and will cause the repetition rate of the pulses 13 produced thereby to be decreased so as to accommodate the longer propagation delay time observed in the array 10 when the temperature is other than normal room temperature.

It can be seen that there is provided by this invention novel apparatus and a method for operating a semiconductor logic circuit array by sensing the temperature of the array and controlling the rate at which timing or clock pulses are generated and applied to the array as a function of temperature. By doing so, digital signals can be clocked through the array at a rate substantially higher than can be achieved when the system is designed for operation at the worst case of temperature extremes.

It will be obvious to those skilled in the arts that there are modifications of the circuitry employed to implement the present invention that may be made. While a particular embodiment has been discussed and described in detail, it is to be understood that the invention is not limited thereto and that it is contemplated to cover any such modifications as fall within the true spirit and scope of the invention as defined by the appended claims.

What is claimed as new and desired to be secured by Letters Patent of the United States is:

1. In a digital logic circuit array of the type wherein digital data signals are propagated therethrough in synchronism with timed gating signals having a variable pulse repetition rate, the combination comprising:
- a variable frequency pulse generator for generating timed gating signals having a variable pulse repetition rate;
- a source of digital data signals;
- a digital logic circuit adapted to receive said digital data signals from said source of digital data signals and to receive said gating signals from said pulse generator; and,
- temperature responsive means operatively connected to said pulse generator and controlling the pulse repetition rate of said pulse generator for gating said digital data signals through said logic circuit at a pulse repetition rate that is a function of ambient temperature.

2. A method for operating a semiconductor logic circuit array of the type wherein digital data signals are allowed to propagate through the array in synchronism with sequentially applied timing pulses comprising the steps of:
- generating a series of timing pulses;
- applying said timing pulses to an array of semiconductor logic circuits;
- generating digital data signals;
- applying said digital data signals to said array of logic circuits;
- varying the propagation delay time of said digital data signals through said array of logic circuits as a function of the temperature variation thereof;
- sensing the temperature of said array of logic circuits;
- varying the rate at which said timing pulses are generated as a function of the temperature of said array of logic circuits;
- synchronizing the variation of the rate at which said timing pulses are generated with the variation of said propagation delay time.

3. The combination comprising:
- a variable frequency pulse generator for generating gating pulses having a variable pulse repetition rate;
- a digital logic circuit having a variable propagation delay of digital data signals propagated therethrough which delay is temperature dependent;
- a source of digital data signals coupled to said digital logic circuit for propagating said digital data signals therethrough;
- means coupling said gating pulses to said digital logic circuit; and,
- temperature responsive means coupled to said pulse generator for varying said pulse repetition rate in synchronism with the variable propagation delay of said digital data signals through said digital logic circuit.

4. The method of optimizing the propagation rate of digital data signals through a digital logic circuit having a temperature dependent propagation delay, comprising:
- generating a series of gating pulses;
- coupling a digital data signal to a digital logic circuit that has a variable propagation delay of said digital data signal therethrough that is temperature dependent;
- coupling said gating pulses to said digital logic circuit;
- sensing the change of temperature of said digital logic circuit;
- varying the pulse repetition rate of said gating pulses in response to said change of temperature; and,
- synchronizing said pulse repetition rate variation with said propagation delay variation.

* * * * *